United States Patent
Li et al.

(10) Patent No.: US 12,281,723 B2
(45) Date of Patent: Apr. 22, 2025

(54) GAS PRESSURE BALANCE VALVE, GAS PRESSURE BALANCE METHOD, AND LOAD LOCKING CHAMBER

(71) Applicant: CHANGXIN MEMORY TECHNOLOGIES, INC., Hefei (CN)

(72) Inventors: Wenzhe Li, Hefei (CN); Wenbo Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 427 days.

(21) Appl. No.: 17/808,495

(22) Filed: Jun. 23, 2022

(65) Prior Publication Data
US 2023/0250894 A1    Aug. 10, 2023

Related U.S. Application Data

(63) Continuation of application No. PCT/CN2022/087386, filed on Apr. 18, 2022.

(30) Foreign Application Priority Data

Feb. 10, 2022    (CN) .......................... 202210126263.1

(51) Int. Cl.
*F16K 47/08*    (2006.01)
*F16K 17/168*    (2006.01)
(Continued)

(52) U.S. Cl.
CPC ............ *F16K 47/08* (2013.01); *F16K 17/168* (2013.01); *F16K 51/02* (2013.01); *G05D 16/028* (2019.01);
(Continued)

(58) Field of Classification Search
CPC . F16K 47/08; F16K 17/168; Y10T 137/88054
See application file for complete search history.

(56) References Cited

U.S. PATENT DOCUMENTS

1,023,843 A * 4/1912 Hall .................... F16L 37/23
                                                    137/614
2,999,512 A * 9/1961 Eugene .................. B23Q 5/26
                                                    137/614.16
(Continued)

FOREIGN PATENT DOCUMENTS

CN     1925110 A     3/2007
CN     104620353 A   5/2015
(Continued)

*Primary Examiner* — Robert K Arundale
(74) *Attorney, Agent, or Firm* — Syncoda LLC; Feng Ma

(57) ABSTRACT

A gas pressure balance valve includes a valve body, a one-way valve and a buffer assembly. The valve body includes a gas inlet end and a gas outlet end, the gas inlet end is connected with a first gas pressure area, the gas outlet end is connected with a second gas pressure area, and a pressure difference is existed between the first gas pressure area and the second gas pressure area. The one-way valve is located in the valve body, and configured to achieve the balance between the pressures of the first gas pressure area and the second gas pressure area. The buffer assembly is located between the gas inlet end and the one-way valve, and configured to adjust the pressure on the surface of the one-way valve.

16 Claims, 13 Drawing Sheets

(51) Int. Cl.
*F16K 51/02* (2006.01)
*G05D 16/00* (2006.01)
*H01L 21/67* (2006.01)

(52) U.S. Cl.
CPC . *H01L 21/67201* (2013.01); *Y10T 137/88054* (2015.04)

(56) References Cited

U.S. PATENT DOCUMENTS

| | | | | |
|---|---|---|---|---|
| 4,569,636 | A * | 2/1986 | Bauer | F04C 28/24 137/527 |
| 5,491,976 | A * | 2/1996 | Rock | F01N 3/32 137/506 |
| 5,577,531 | A * | 11/1996 | Hayden | E03F 7/04 137/369 |
| 6,513,543 | B1 * | 2/2003 | Noll | E03C 1/106 137/454.2 |
| 2004/0007265 | A1 * | 1/2004 | Coscarella | F16K 3/0218 137/315.41 |
| 2004/0035476 | A1 | 2/2004 | Holmes | |
| 2005/0183783 | A1 | 8/2005 | Holmes | |
| 2015/0197851 | A1 | 7/2015 | Yoon et al. | |
| 2024/0102568 | A1 * | 3/2024 | Phillips | F16K 27/067 |

FOREIGN PATENT DOCUMENTS

| | | |
|---|---|---|
| CN | 105952936 A | 9/2016 |
| CN | 206802412 U | 12/2017 |
| CN | 211288292 U | 8/2020 |
| CN | 212360209 U | 1/2021 |
| CN | 213236103 U | 5/2021 |

* cited by examiner

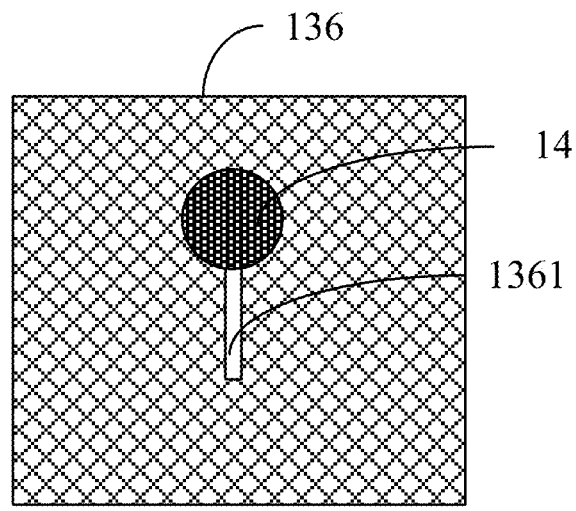

FIG. 12C

| A gas pressure balance valve is provided between a first gas pressure area and a second gas pressure area having a pressure difference therebetween, the gas inlet end of a valve body of the gas pressure balance valve is connected with the first gas pressure area, and the gas outlet end of the valve body is connected with the second gas pressure area | — S1301 |

| The pressure of the first gas pressure area is adjusted through the buffer assembly and the one-way valve in the valve body to achieve the balance between the pressures of the first gas pressure area and the second gas pressure area | — S1302 |

FIG. 13

GAS PRESSURE BALANCE VALVE, GAS PRESSURE BALANCE METHOD, AND LOAD LOCKING CHAMBER

CROSS-REFERENCE TO RELATED APPLICATIONS

This is a continuation application of International Patent Application No. PCT/CN2022/087386 filed on Apr. 18, 2022, which claims priority to Chinese patent application No. 202210126263.1 filed on Feb. 10, 2022. The disclosures of these applications are hereby incorporated by reference in their entirety.

BACKGROUND

The one-way valve, also known as the retention valve or the non-return valve, is mainly used to prevent reverse flow of oil-flow in a hydraulic system, or to prevent reverse flow of a compressed gas in a pneumatic system, etc., and the one-way valve has the capabilities of one-way conduction and reverse retention.

In a semiconductor manufacturing process, it is usually necessary to adjust the vacuum state and the atmospheric pressure state of a chamber, in which case the one-way valve is needed to maintain pressure balance between the chamber and the external atmospheric environment. However, in practical application, sudden pressure increase and pressure release may cause irreversible impact on the one-way valve, which is prone to cause damage of the one-way valve.

SUMMARY

The present disclosure relates to but is not limited to a gas pressure balance valve, a gas pressure balance method, and a load locking chamber.

According to the first aspect, embodiments of the present disclosure provide a gas pressure balance valve, including: a valve body, a one-way valve and a buffer assembly.

The valve body includes a gas inlet end and a gas outlet end, the gas inlet end is configured to be connected with a first gas pressure area, the gas outlet end is configured to be connected with a second gas pressure area, and a pressure difference is existed between the first gas pressure area and the second gas pressure area.

The one-way valve is located in the valve body, and configured to perform a pressure adjustment to achieve the balance between the pressures of the first gas pressure area and the second gas pressure area.

The buffer assembly is located between the gas inlet end and the one-way valve, and configured to adjust the pressure on the surface of the one-way valve.

According to the second aspect, embodiments of the present disclosure provide a gas pressure balance method, including:

providing a gas pressure balance valve between a first gas pressure area and a second gas pressure area having a pressure difference therebetween, with a gas inlet end of a valve body of the gas pressure balance valve being connected with the first gas pressure area, and a gas outlet end being connected with the second gas pressure area; and adjusting the pressure of the first gas pressure area, the pressure of the first gas pressure area is adjusted through a buffer assembly and a one-way valve in the valve body, to achieve the balance between the pressures of the first gas pressure area and the second gas pressure area.

According to the third aspect, embodiments of the present disclosure provide a load locking chamber, including a chamber, the gas pressure balance valve of the first aspect and a suction port.

The chamber is configured to accommodate a substrate.

A gas inlet end of a valve body of the gas pressure balance valve is connected with the chamber, and a gas outlet end of a valve body of the gas pressure balance valve is connected with the atmospheric environment.

The suction port is formed on the chamber and connected to a suction pump for adjusting the pressure in the chamber through the suction port.

BRIEF DESCRIPTION OF THE DRAWINGS

FIG. 12C is a third illustration of the schematic view of a process for adjusting the degree of opening of a pipe orifice provided in embodiments of the present disclosure;

FIG. 13 illustrates a schematic flowchart of a gas pressure balance method provided in embodiments of the present disclosure;

DETAILED DESCRIPTION

Figure 1:
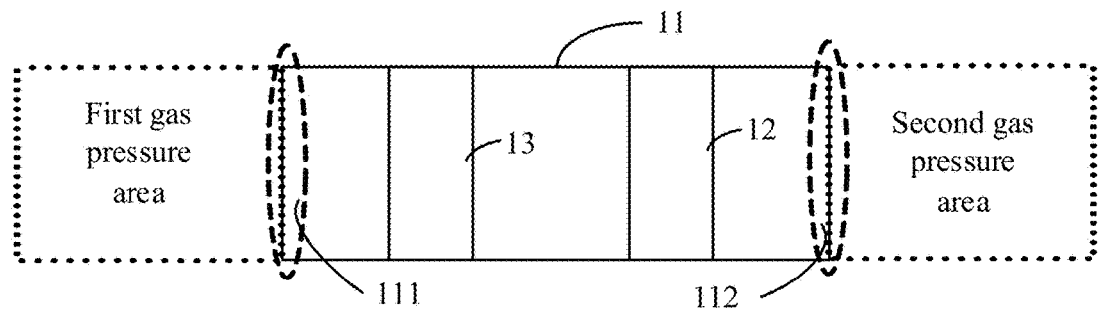
FIG. 1 illustrates a schematic view of the structure of a gas pressure balance valve provided in embodiments of the present disclosure.

The technical solutions in embodiments of the present disclosure are clearly and completely described below with reference to the accompanying drawings in the embodiments of the present disclosure. It can be understood that the specific embodiments described here are only used for explaining related disclosure, but are not intended to limit the present disclosure. In addition, it should also be noted that, for ease of description, the accompanying drawings illustrate only the part related to the relevant disclosure.

Unless otherwise defined, all technical and scientific terms used herein have the same meanings as commonly understood by persons skilled in the field of the present disclosure. The terms used herein are merely intended for describing the objective of the embodiments of the present disclosure, instead of limiting the present disclosure.

The expression "some embodiments" is used in the following description to describe a subset of all possible embodiments; however, it can be understood that the "some embodiments" may refer to the same subset or different subsets of all possible embodiments, and can be combined with each other without conflict.

It should be noted that the terms "first", "second", and "third" involved in the embodiments of the present disclosure are merely used for distinguishing similar objects, rather than describing any specific sequence of the objects. It should be understood that the specific sequences or orders of "first", "second", and "third" may be exchanged in a proper condition, so that the embodiments of the present disclosure described herein can be implemented in sequences except for those illustrated or described herein.

The atmospheric pressure balance valve is one type of one-way valve, and is capable of balancing the pressure by adjust a gap between a valve core and a valve seat. The existing atmospheric pressure balance valve is directly connected to the inside of a chamber, and plays the role of releasing pressure when the pressure in the chamber is higher than the external atmospheric pressure. However, in actual operation, a sudden pressure rise and a sudden pressure release may cause a violent impact on the valve core, which may cause damage of the valve.

On this basis, embodiments of the present disclosure provide a gas pressure balance valve. The gas pressure balance valve includes: a valve body, a one-way valve and a buffer assembly. The valve body includes a gas inlet end and a gas outlet end, the gas inlet end is configured to be connected with a first gas pressure area, the gas outlet end is configured to be connected with a second gas pressure area, and a pressure difference is existed between the first gas pressure area and the second gas pressure area. The one-way valve is located in the valve body, and configured to perform a pressure adjustment to achieve the balance between the pressures of the first gas pressure area and the second gas pressure area. The buffer assembly is located between the gas inlet end and the one-way valve, and configured to adjust the pressure on the surface of the one-way valve. In this case, the buffer assembly is additionally provided between the gas inlet end and the one-way valve, and the buffer assembly can adjust the pressure on the surface of the one-way valve, such that the surface of the one-way valve will not be suddenly subjected to a high pressure, thus the function of protecting the one-way valve and avoiding damage to the one-way valve can be achieved.

Embodiments of the present disclosure will be described in detail below with reference to the accompanying drawings.

In one embodiment of the present disclosure, FIG. 1 illustrates a schematic view of a gas pressure balance valve according to embodiments of the present disclosure. As illustrated in FIG. 1, the gas pressure balance valve may include a valve body 11, a one-way valve 12 and a buffer assembly 13. The valve body 11 includes a gas inlet end 111 and a gas outlet end 112, the gas inlet end 111 is configured to be connected with a first gas pressure area, the gas outlet end 112 is configured to be connected with a second gas pressure area. and a pressure difference is existed between the first gas pressure area and the second gas pressure area;

The one-way valve 12 is located in the valve body 11, and configured to perform adjustment to achieve the balance between the pressures of the first gas pressure area and the second gas pressure area; and The buffer assembly 13 is located between the gas inlet end 111 and the one-way valve 12, and configured to adjust the pressure on a surface of the one-way valve 12.

It should be noted that the gas pressure balance valve in embodiments of the present disclosure can also be used as an atmospheric pressure balance valve, and can be applied to a semiconductor device (such as a load locking chamber) to maintain a balance between pressures of the inside and the outside of a device chamber. For existing atmospheric pressure balance valves used in an assembly of semiconductor devices, the one-way valve directly connect the chamber to the external environment. During pressure release of the chamber, due to excessively high recovered pressure within a short period of time, the valve body of the one-way valve will be impacted. In actual application, the atmospheric pressure balance valve is often damaged and the valve cannot be reclosed, resulting in gas leakage at the chamber.

In order to avoid a damage and other problems due to an excessive pressure on the surface of the one-way valve caused by a large amount of gas from rapidly rushing to the one-way valve in a short period of time, embodiments of the present disclosure provide a gas pressure balance valve. As illustrated in FIG. 1, the valve body 11 of the gas pressure balance valve includes the gas inlet end 111 and the gas outlet end 112, the gas inlet end 111 connects the gas pressure balance valve with the first gas pressure area, and the gas outlet end 112 connects the gas pressure balance valve with the second gas pressure area.

Taking a load locking chamber as an example, the first gas pressure area is a chamber of the load locking chamber, and the second gas pressure area is the external environment. The pressure of the external environment is basically constant, while the pressure in the chamber of the load locking chamber changes along with actual technological process, for example, at a negative pressure state. In this case, the first gas pressure area is in the relatively low pressure state, and the second gas pressure area is in the relatively high pressure state, i.e., the pressure of the first gas pressure area is lower than that of the second gas pressure area. In order to achieve a balance between pressures of the first gas pressure area and the second gas pressure area to open the load locking chamber, the pressure of the first gas pressure area needs to be increased. When the increase in the pressure is excessive, for example, when the pressure of the first gas pressure is increased to be higher than the pressure of the second gas pressure area, the first gas pressure area is in the relatively high pressure state, and the second gas pressure area is in the relatively low pressure state, i.e., the pressure of the first gas pressure area is higher than that of the second gas pressure area. Then, pressure release can be performed by the pressure balance valve provided in the embodiments of the present disclosure, i.e., the gas in the first gas pressure area is released to the second gas pressure area to maintain pressure balance. The expression "a pressure difference is existed between the first gas pressure area and the second gas pressure area" in the embodiments of the present disclosure may refer to an initial pressure state and may also refer to a pressure state in an intermediate process. When there is any pressure difference between the first gas pressure area and the second gas pressure area, the gas pressure balance valve provided in the embodiments of the present disclosure can be used to achieve the pressure balance.

The one-way valve 12 is located inside the valve body 11 and configured to perform pressure adjustment to achieve the balance between pressures of the first gas pressure area and the second gas pressure area. The one-way valve 12 only allows a gas to pass in one single direction. That is, the one-way valve 12 only discharges the gas from the first gas pressure area to the second gas pressure area when the pressure release of the first gas pressure area is required, and the gas in the second gas pressure area cannot pass through the one-way valve 12.

The valve body 11 further includes the buffer assembly 13. The buffer assembly 13 is provided between the gas inlet end 111 and the one-way valve 12. After the pressure of the first gas pressure area is increased, the buffer assembly 13 plays the role of buffering the gas flowing to the one-way valve 12 during the pressure release of the first gas pressure area, to adjust the pressure on the surface of the one-way valve 12, such that the pressure on the surface of the one-way valve 12 is increased slowly, to avoid a significant pressure suddenly applied to the surface of the one-way valve 12, thereby avoiding damage to the one-way valve 12 caused by the significant instantaneous pressure.

Figure 2:
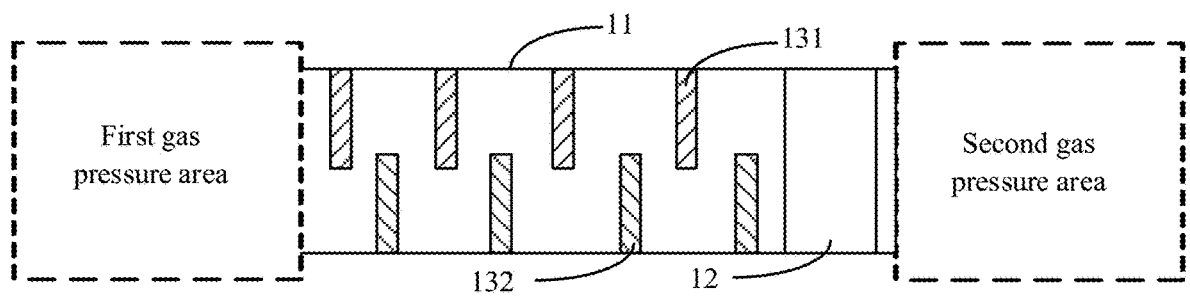
FIG. 2 illustrates another schematic view of a gas pressure balance valve provided in embodiments of the present disclosure.

In one possible implementation, FIG. 2 illustrates schematic view of the gas pressure balance valve provided in embodiments of the present disclosure. As illustrated in FIG. 2, the buffer assembly 13 may include: a plurality of upper baffles 131 and a plurality of lower baffles 132.

The upper baffles 131 are located on an inner wall on one side of the valve body 11 and extend towards the inside of the valve body 11; and The lower baffles 132 are located on an inner wall on another side of the valve body 11 and extend towards the inside of the valve body 11. The upper baffles 131 and the lower baffles 132 are arranged alternately at intervals in a direction towards the one-way valve 12.

It should be noted that, as illustrated in FIG. 2, in one specific example of the buffer assembly 13, the upper baffles 131 and the lower baffles 132 may be respectively provided on the inner walls of the valve body 11, and the upper baffles 131 and the lower baffles 132 form the buffer assembly 13. The upper baffles 131 are located on an inner wall of an upper part of the valve body 11 and extend towards the inside of the valve body 11, the lower baffles 132 are located on an inner wall of an lower part of the valve body 11 and extend towards the inside of the valve body 11. In the direction from the buffer assembly 13 to the one-way valve 12, the upper baffles 131 are arranged alternately with the lower baffles 132 at intervals. The upper baffles 131 and the plurality of lower baffles 132 may have the same size, such as height and width.

Since the upper baffles 131 arranged alternately with the lower baffles 132 inside the valve body 11 in front of the one-way valve 12, the gas flow flowing to the one-way valve 12 will gently flow to the one-way valve 12 during pressure release of the first gas pressure area. The gas flow is buffered by the upper baffles 131 and the lower baffles 132 to form a corrugated gas flow, so that the gas flow is weak and will not impact the one-way valve 12, thereby avoiding damage to the one-way valve 12.

Figure 3:
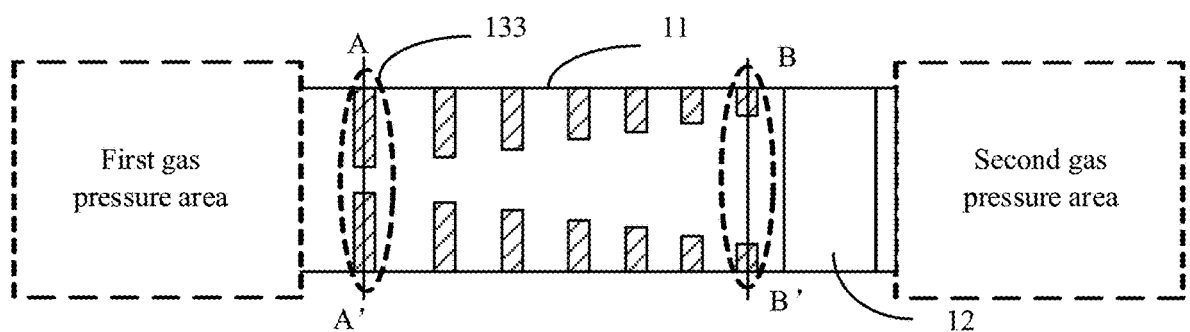
FIG. 3 illustrates another schematic view of a gas pressure balance valve provided in embodiments of the present disclosure.

In another possible implementation, FIG. 3 illustrates another schematic view of a gas pressure balance valve provided in embodiments of the present disclosure. As illustrated in FIG. 3, the buffer assembly 13 may include a plurality of ring-shaped baffles 133.

The ring-shaped baffles 133 are arranged along the inner wall of the valve body 11 and spaced apart from each other. The inner diameters of ring-shaped baffles 133 are gradually increased.

It should be noted that, as illustrated in FIG. 3, in another specific example of the buffer assembly 13, a plurality of ring-shaped baffles 133 may be provided on the inner wall of the valve body 11. FIG. 3 illustrates a schematic view of the cross section of the gas pressure balance valve in the front view direction. The plurality of ring-shaped baffles 133 are arranged along the inner wall of the valve body 11 and spaced apart from each other, and the inner diameters of the ring-shaped baffles 133 are gradually increased in the direction from the first gas pressure area to the second gas pressure area.

Figure 4A:
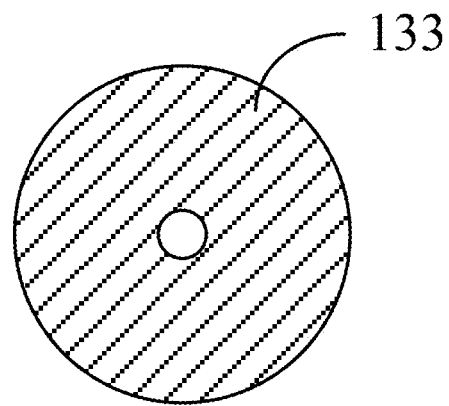
FIG. 4A illustrates a schematic view of the cross section along line AA' in FIG. 3.
Figure 4B:
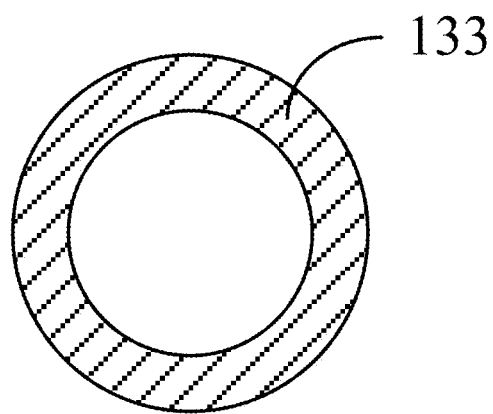
FIG. 4B illustrates a schematic view of the cross section along line BB' in FIG. 3.

FIG. 4A and FIG. 4B illustrate schematic view of the cross section of the buffer assembly 13 provided in embodiments of the present disclosure. FIG. 4A illustrates the schematic view of the cross section along line AA' in FIG. 3, and FIG. 4B illustrates the schematic view of the cross section along line BB' in FIG. 3. As illustrated in FIG. 4A and FIG. 4B, the valve body 11 may be a cylindrical valve body, and the ring-shaped baffles 133 arranged along the inner wall of the valve body 11 may be in the shape of a circular ring. Moreover, in the direction from line AA' to line BB', the inner diameters of the circular rings of the ring-shaped baffles 133 are gradually increased.

Figure 5A:
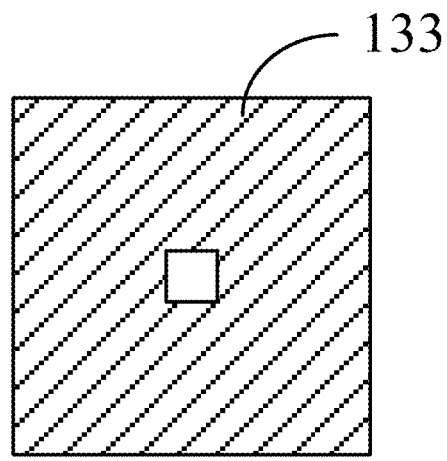
FIG. 5A illustrates another schematic view of the cross section along line AA' in FIG. 3.
Figure 5B:
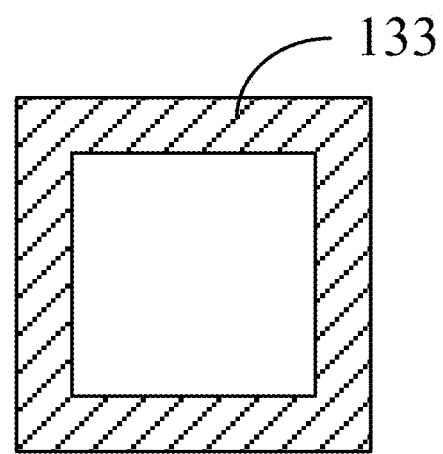
FIG. 5B illustrates another schematic view of the cross section along line BB' in FIG. 3.

FIG. 5A and FIG. 5B illustrate schematic view of the cross section of the buffer assembly 13 provided in embodiments of the present disclosure. FIG. 5A illustrates the schematic view of the cross section along line AA' in FIG. 3, and FIG. 5B illustrates the schematic view of the cross section along line BB' in FIG. 3. As illustrated in FIG. 5A and FIG. 5B, the valve body 11 may be a square valve body, and the ring-shaped baffles 133 arranged along the inner wall of the valve body 11 may be in the shape of a square ring. Moreover, in the direction from line AA' to line BB', the sizes of square openings in the centers of the ring-shaped baffles 133 are gradually increased.

In this case, the ring-shaped baffles 133 having the inner diameters gradually increased are provided inside the buffer assembly 13. Due to the small size of the opening of the leftmost ring-shaped baffle 133, the gas flowing from the first gas pressure area to the one-way valve 12 will not flow to the one-way valve 12 instantaneously during the pressure release, but gradually flows from the ring-shaped baffle 133 having the smaller opening to the ring-shaped baffle 133 having the larger opening, such that no impact is applied to the one-way valve 12 and damage to the one-way valve 12 is avoided.

It should also be noted that FIG. 4A, FIG. 4B, FIG. 5A and FIG. 5B are merely examples of the buffer assembly 13. In actual operation, the buffer assembly 13 may be in various other shapes, which is not specifically limited in the embodiments of the present disclosure.

Figure 6:
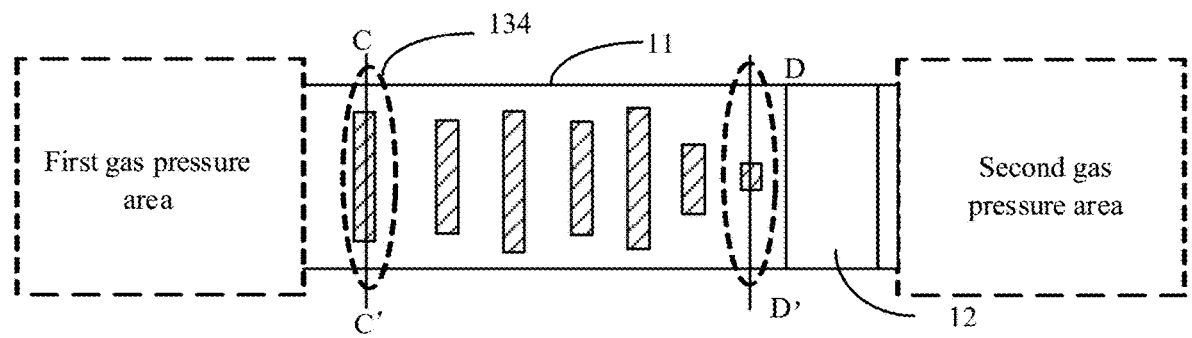
FIG. 6 illustrates another schematic view of a gas pressure balance valve provided in embodiments of the present disclosure.

In still another possible implementation, FIG. 6 illustrates schematic view of a gas pressure balance valve provided in embodiments of the present disclosure. As illustrated in FIG. 6, the buffer assembly 13 may include a plurality of baffles 134.

The baffles 134 are located in the valve body 11 and spaced part from each other inside the valve body 11. The outer diameters of the plurality of baffles 134 are different from one another, and a gap is formed between each of the baffles 134 and the inner wall of the valve body 11.

Figure 7A:
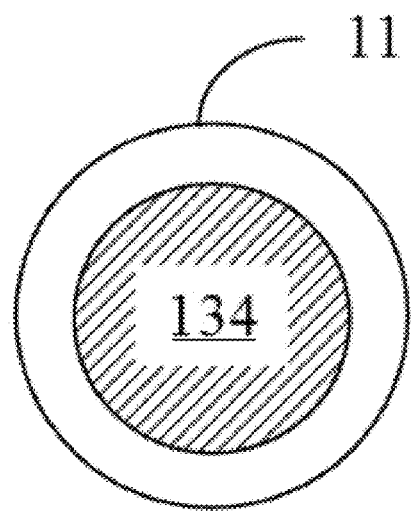
FIG. 7A illustrates a schematic view of the cross section along line CC' in FIG. 6.
Figure 7B:
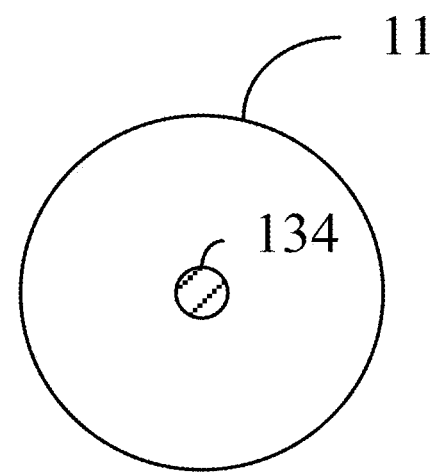
FIG. 7B illustrates a schematic view of the cross section along line DD' in FIG. 6.

FIG. 7A and FIG. 7B illustrate schematic view of the cross section of the buffer assembly 13 provided in embodiments of the present disclosure. FIG. 7A illustrates the schematic view of the cross section along line CC' in FIG. 6, and FIG. 7B illustrates the schematic view of the cross section along line DD' in FIG. 6. As illustrated in FIG. 7A and FIG. 7B, the valve body 11 may be a cylindrical valve body, the baffles 134 provided inside the valve body 11 may be in the shape of a circle. The diameters of the baffles 134 are different from one another, and then gaps of different sizes are formed between the baffles and the inner wall of the valve body 11.

Figure 8A:
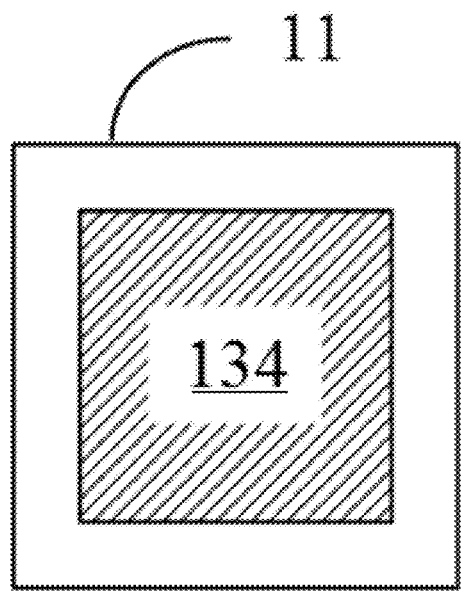
FIG. 8A illustrates another schematic view of the cross section along line CC' in FIG. 6.
Figure 8B:
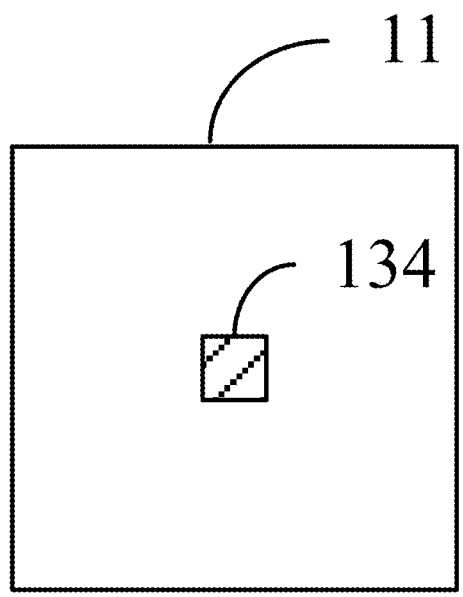
FIG. 8B illustrates another schematic view of the cross section along line DD' in FIG. 6.

FIG. 8A and FIG. 8B illustrate schematic view of the cross section of the buffer assembly 13 provided in embodiments of the present disclosure. FIG. 8A illustrates the schematic view of the cross section along line CC' in FIG. 6, and FIG. 8B illustrates the schematic view of the cross section along line DD' in FIG. 6. As illustrated in FIG. 8A and FIG. 8B, the valve body 11 may be a square valve body, and the baffles 134 provided inside the valve body 11 may be in the shape of a square. The sizes of the baffles 134 are different from one another, and then gaps of different sizes are formed between the baffles and the inner wall of the valve body 11.

In addition, it should be noted that the baffles 134 may be connected and fixed onto the inner wall of the valve body 11, for example by connection members such as brackets (not illustrated in FIG. 7A, FIG. 7B and FIG. 8), which will not be described in detail in the embodiments of the present disclosure.

In this case, the baffles 134 are provided inside the buffer assembly 13, during pressure release. The gas passes through the gaps between the baffles 134 and the inner wall of the valve body 12, and thus the gas flowing from the first gas pressure area to the one-way valve 12 will not flow to the one-way valve 12 instantaneously, but gradually flows to the surface of the one-way valve 12 through the gaps, such that no impact is applied to the one-way valve 12 and damage to the one-way valve 12 is avoided.

In view of the above, FIG. 2 to FIG. 8B illustrate that the buffer assembly 13 having the fixed shape is provided in the gas pressure balance valve. Thanks to the buffer assembly, the flow direction and flow rate of the gas form the first gas pressure area is changed after the gas enters the gas pressure balance valve, thereby reducing the pressure on the surface of the one-way valve 12 and effectively protecting the one-way valve 12.

In addition, in the buffer assembly 13, the foregoing implementations can also be used in any combination to implement the function of protecting the one-way valve 12.

Figure 9A:
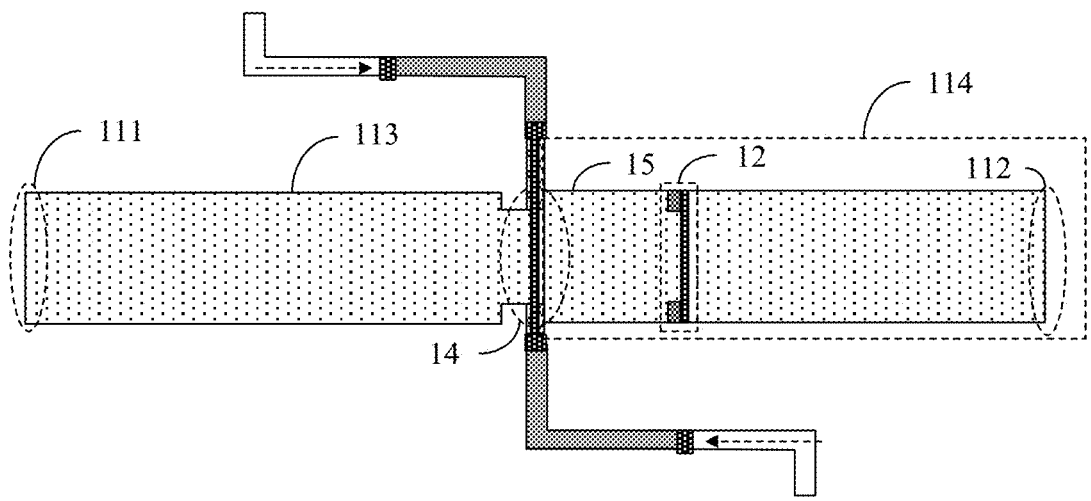
FIG. 9A is the schematic view of the gas pressure balance valve.
Figure 9B:
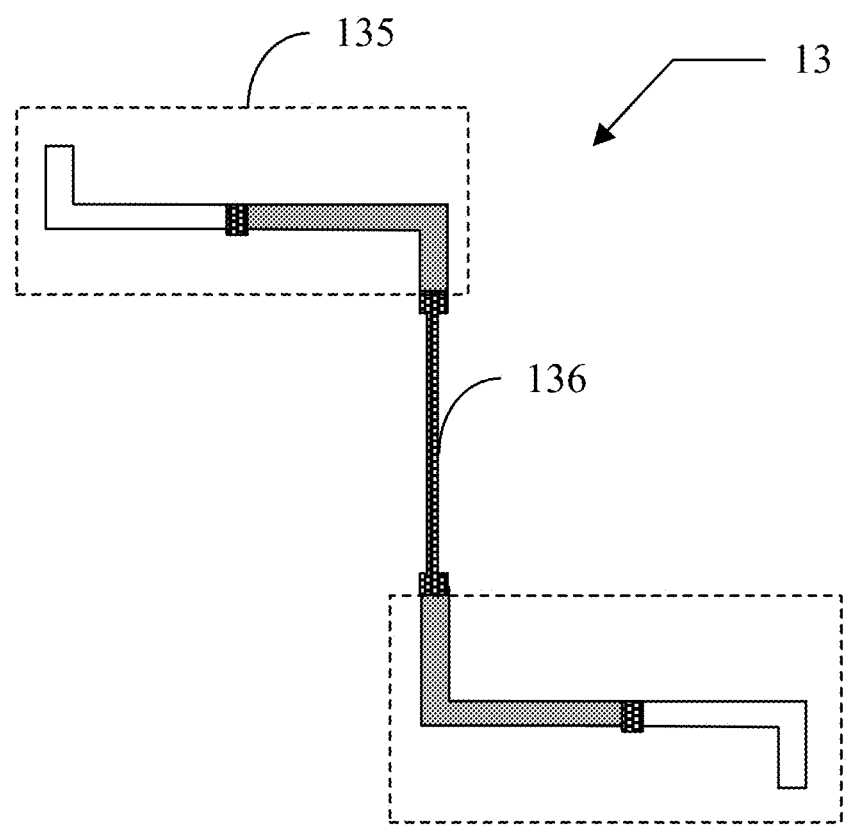
FIG. 9B is the schematic view of the buffer assembly 13.

Further, in the embodiments of the present disclosure, the buffer assembly 13 may further be configured to be a dynamic assembly. FIG. 9A and FIG. 9B illustrate schematic view of a gas pressure balance valve provided in embodiments of the present disclosure. As illustrated in FIG. 9A and FIG. 9B, the valve body 11 includes a first pipe 113 and a second pipe 114. One end of the first pipe 113 forms the gas inlet end 111, one end of the second pipe 114 forms the gas outlet end 112, and the other end of the first pipe 113 and the other end of the second pipe 114 face towards each other and form a pipe orifice 14. The one-way valve 12 is located in the second pipe 114, and the buffer assembly 13 is located at the pipe orifice 14 and acts along with a change in the pressure of the first gas pressure area to adjust the degree of opening of the pipe orifice 14 and then dynamically adjust the pressure on the surface of the one-way valve 12.

It should be noted that FIG. 9A is the schematic view of the gas pressure balance valve, and FIG. 9B is the schematic view of the buffer assembly 13. As illustrated in FIG. 9A and FIG. 9B, the valve body 11 of the gas pressure balance valve may include the first pipe 113 on the left side and the second pipe 114 on the right side. The left end of the first pipe 113 forms the gas inlet end 111 and is connected to the first gas pressure area, the right end of the second pipe 114 forms the gas outlet end 112 and is connected to the second gas pressure area. The one-way valve 12 is located in the second pipe 114. The right end of the first pipe 113 and the left end of the second pipe 114 face towards each other. The pipe orifice 14 is formed at a junction between the right end of the first pipe 113 and the left end of the second pipe 114. The buffer assembly 13 is located between the first pipe 113 and the second pipe 114, and specifically at the pipe orifice 14.

It should also be noted that the buffer assembly 13 can act along with the change in the pressure of the first gas pressure area, so as to adjust the degree of opening of the pipe orifice 14. The gas released from the first gas pressure area flows via the first pipe 113 and the pipe orifice 14 to the one-way valve 12, and then the gas is discharged to the second gas pressure area through the one-way valve 12. The flow rate of the gas flowing through the pipe orifice 14 depends on the degree of opening of the pipe orifice 14. By controlling the degree of opening of the pipe orifice 14, the flow rate of the gas can be controlled, so as to change the pressure of the gas reaching the surface of the one-way valve 12 to dynamically adjust the pressure on the surface of the one-way valve 12.

Specifically, in the embodiments of the present disclosure, when the pressure of the first gas pressure area is greater than or equal to a preset pressure threshold, i.e., when the pressure in the first pipe 113 is greater than or equal to the preset pressure threshold, the buffer assembly 13 can be driven to gradually open the pipe orifice 14, such that the gas released from the first gas pressure area can be discharged to the second gas pressure area to maintain the balance between pressures of the first gas pressure area and the second gas pressure area. Moreover, since the pipe orifice 14 is gradually opened, there is no significant impact force applied onto the surface of the one-way valve 12, thereby protecting the one-way valve 12. In addition, when the pressure of the first gas pressure area is less than the preset pressure threshold, the buffer assembly 13 is driven to gradually close the pipe orifice 14.

The preset pressure threshold may be equal to the pressure value of the second gas pressure area. In one embodiment, for example, this pressure value may be 760 T (Torr), i.e., the atmospheric pressure value.

In some embodiments, as illustrated in FIG. 9A and FIG. 9B, the area between the one-way valve 12 and the pipe orifice 14 forms a buffer space 15. The buffer assembly 13 may include a drive member 135 and a blocking sheet 136, and the blocking sheet 136 is connected to the drive member 135 and movable with respect to the pipe orifice 14 under the drive of the drive member 135 to adjust the degree of opening of the pipe orifice 14.

It should be noted that in the embodiments of the present disclosure, taking FIG. 9A and FIG. 9B as an example, in the second pipe 114, the area between the one-way valve 12 and the pipe orifice 14 forms a buffer space 15. In this case, the gas passing through the pipe orifice 14 first enters the buffer space 15, and then the pressure in the buffer space 15 is gradually increased. When the pressure in the buffer space 15 is greater than the pressure of the second gas pressure area, the one-way valve 12 will be opened outwards, so as to discharge the gas in the buffer space 15 to the second gas pressure area.

It should also be noted that, in the embodiments of the present disclosure, still taking FIG. 9A and FIG. 9B as an example, the buffer assembly 13 may include the drive member 135 and the blocking sheet 136. Both upper and lower ends of the blocking sheet 136 are connected to the drive member 135, so that the drive member 135 can drive the blocking sheet 136 to move upwards or downwards, and thus the blocking sheet 136 is movable with respect to the pipe orifice 14 to adjust the degree of opening of the pipe orifice 14.

In some embodiments, a pressure release hole is provided on the blocking sheet 136, and the blocking sheet 136 is driven by the drive member 135 to adjust the degree of opening of the pipe orifice 14 through the pressure release hole.

It should be noted that the pressure release hole can be provided on the blocking sheet 136. When the pipe orifice 14 is closed, the pressure release hole does not coincide with the pipe orifice 14 so that no gas flows through the pipe orifice. When the case that the pipe orifice 14 is opened, the pressure release hole coincides with the pipe orifice 14, so that the gas can reach the one-way valve 12 after passing through the pressure release hole and the pipe orifice 14 and is then discharged. In this case, when the blocking sheet 136 moves under the drive of the drive member 135, the degree of opening of the pipe orifice 14 can be adjusted through the pressure release hole, so as to adjust the pressure on the surface of the one-way valve 12.

The shape and size of the pressure release hole may be the same as or different from those of the pipe orifice, which is not specifically limited in the embodiments of the present disclosure.

Figure 10A:
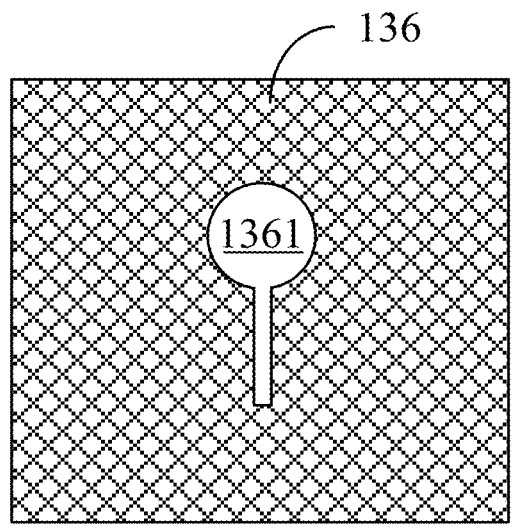
FIG. 10A is a first illustration of the schematic view of the shape of a pressure release hole provided in embodiments of the present disclosure.
Figure 10B:
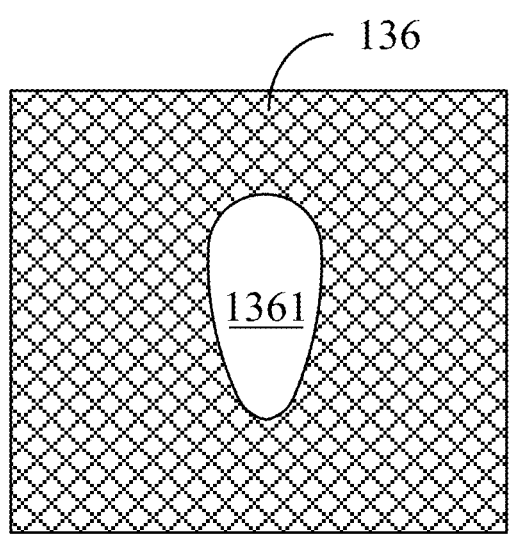
FIG. 10B is a second illustration of the schematic view of the shape of a pressure release hole provided in embodiments of the present disclosure.

In some embodiments, FIG. 10A and FIG. 10B illustrate a schematic view of the shape of the pressure release hole 1361 provided in embodiments of the present disclosure. As illustrated in FIG. 10A and FIG. 10B, the shape of the opening of the pressure release hole 1361 on the blocking sheet 136 is flared from one end to the other end, and the inner diameter at the maximum opening position of the pressure release hole is greater than or equal to the inner diameter of the pipe orifice 14.

It should be noted that FIG. 10A and FIG. 10B respectively illustrate two exemplary shapes of the pressure release hole 1361. As illustrated in FIG. 10A and FIG. 10B, the pressure release hole 1361 is formed on the blocking sheet 136, and the pressure release hole is gradually flared from the lower end of the pressure release hole 1361 to the upper end of the pressure release hole 1361. When the maximum opening position of the pressure release hole 1361 coincides with the pipe orifice 14, the maximum degree of opening of the pipe orifice is achieved. In the embodiments of the present disclosure, the inner diameter of the pressure release hole 1361 at the maximum opening position is greater than or equal to the inner diameter of the pipe orifice 14, so as to completely open the pipe orifice 14 at the maximum opening position.

It should also be noted that FIG. 10A and FIG. 10B merely illustrate two exemplary shapes of the pressure release hole 1361. In actual application, the pressure release hole 1361 may have any other suitable shape to meet the requirement for the degree of opening of the pipe orifice 14. No limitation is made thereto in the embodiments of the present disclosure.

In some embodiments, the drive member 135 may include at least one of a hydraulic drive member, a pneumatic drive member or a motor drive member.

It should be noted that in the embodiments of the present disclosure, the drive member 135 may be in any form, such as the hydraulic drive member, the pneumatic drive member, the motor drive member, or a combination of two or more of the hydraulic drive member, the pneumatic drive member, or the motor drive member, which is not specifically limited in the embodiments of the present disclosure.

Figure 11:
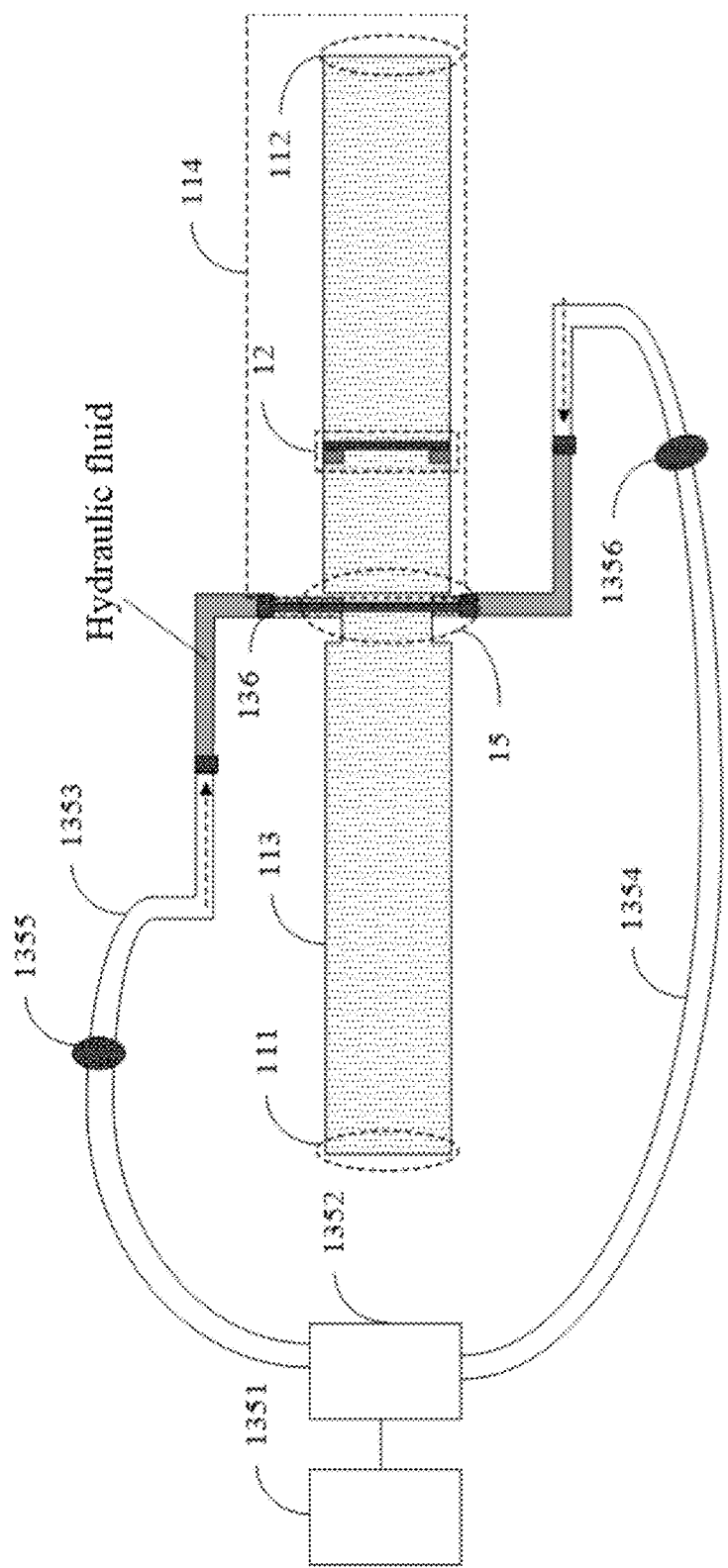
FIG. 11 illustrates another schematic view of a gas pressure balance valve provided in embodiments of the present disclosure.

FIG. 11 illustrates schematic view of a gas pressure balance valve in some embodiments in which the drive member 135 is the hydraulic drive member. As illustrated in FIG. 11, the hydraulic drive member may include: a compressed gas source 1351, a first valve 1352 connected to the compressed gas source 1351, a first pressure introducing pipe 1353 and a second pressure introducing pipe 1354.

One end of the first pressure introducing pipe 1353 is connected to the first valve 1352, the other end of the first pressure introducing pipe 1353 abuts against one end of the blocking sheet 136. A hydraulic fluid is provided in the first pressure introducing pipe 1353.

One end of the second pressure introducing pipe 1354 is connected to the first valve 1352, the other end of the second pressure introducing pipe 1354 abuts against the other end of the blocking sheet 136. A hydraulic fluid is provided in the second pressure introducing pipe 1354.

The compressed gas source 1351 supplies a compressed gas into the first pressure introducing pipe 1353 or the second pressure introducing pipe 1354 through the first valve 1352, so as to drive the hydraulic fluids to drive the blocking sheet 136 to move.

It should be noted that in the embodiments of the present disclosure, taking FIG. 11 as an example, the drive member 135 is the hydraulic drive member, the hydraulic drive member main consists of the following elements: the compressed gas source 1351, the first valve 1352, the first pressure introducing pipe 1353, and the second pressure introducing pipe 1354. The first valve 1352 is connected to the compressed gas source 1351. One end of the first pressure introducing pipe 1353 is connected to the first valve 1352, the other end of the first pressure introducing pipe 1353 abuts against the upper end of the blocking sheet 136, and the hydraulic fluid is provided in the first pressure introducing pipe 1353. One end of the second pressure introducing pipe 1354 is connected to the first valve 1353, the other end of the second pressure introducing pipe 1354 abuts against the lower end of the blocking sheet 136, and the hydraulic fluid is provided in the second pressure introducing pipe 1354.

The compressed gas source 1351 is configured to provide the compressed gas (such as Compressed Dry Air (CDA)). The first valve 1352 may be a solenoid valve; and the first valve 1352 can introduce the compressed gas provided by the compressed gas source 1351 to the first pressure introducing pipe 1353 or the second pressure introducing pipe 1354 according to the pressure of the first gas pressure area.

Figure 12A:
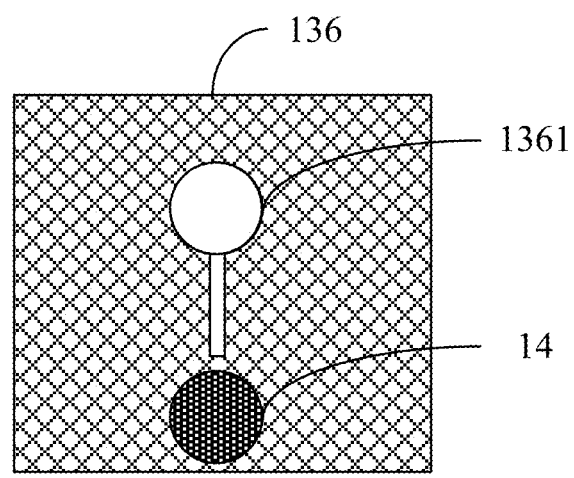
FIG. 12A is a first illustration of the schematic view of a process for adjusting the degree of opening of a pipe orifice provided in embodiments of the present disclosure.
Figure 12B:
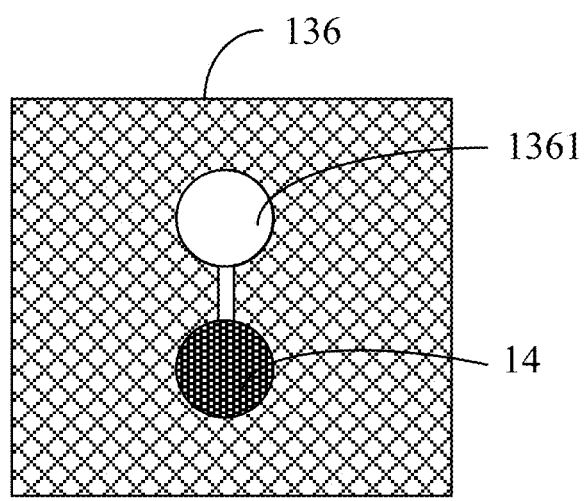
FIG. 12B is a second illustration of the schematic view of a process for adjusting the degree of opening of a pipe orifice provided in embodiments of the present disclosure.

Further, exemplary description is made by taking adjustment to the degree of opening of the pipe orifice through the pressure release hole 1361 illustrated in FIG. 10A as an example. FIG. 12A, FIG. 12B, and FIG. 12C illustrate a schematic view of a process for adjusting the degree of opening of the pipe orifice 14 provided in embodiments of the present disclosure. As illustrated in FIG. 12A, FIG. 12B, and FIG. 12C, when the first gas pressure area is in a vacuum state or in a state in which there is no need to perform pressure balance adjustment, the relative position of the blocking sheet 136 and the pipe orifice 14 is illustrated by FIG. 12A, at which position, the pressure release hole 1361 does not coincide with the pipe orifice 14, and the pipe orifice 14 is in a completely closed state. The upper end of the blocking sheet 136 is connected to the first pressure introducing pipe 1353, and the lower end of the blocking sheet 136 is connected to the second pressure introducing pipe 1354.

When the pressure release of the first gas pressure area is required, for example, when the pressure of the first gas pressure area is greater than the preset pressure threshold, the first valve 1352 introduces the compressed gas provided by the compressed gas source 1351 to the first pressure introducing pipe 1353. After the compressed gas enters the first pressure introducing pipe 1353, the hydraulic fluid in the first pressure introducing pipe 1353 is driven to drive the blocking sheet 136 to move in a first direction (in FIG. 12A, FIG. 12B, and FIG. 12C, the first direction refers to a downward direction). In this case, under the drive of the compressed gas, the blocking sheet 136 gradually moves downwards, such that the pressure release hole 1361 gradually coincides with the pipe orifice 14 from bottom to top to gradually increase the degree of opening of the pipe orifice 14 and gradually open the pipe orifice 14.

In FIG. 12B, under the drive of the compressed gas in the first pressure introducing pipe 1353, the blocking sheet 136 moves downwards, and part of the pipe orifice 14 coincides with the lower end of the pressure release hole 1361, so that the pipe orifice 14 is partially opened. In FIG. 12C, under the drive of the compressed gas in the first pressure introducing pipe 1353, the blocking sheet 136 further moves downwards to a maximum stroke, and the pipe orifice 14 completely coincides with the maximum opening position of the pressure release hole 1361, so that the pipe orifice 14 is completely opened.

That is to say, FIG. 12A, FIG. 12B and FIG. 12C seriatim illustrate the process of gradually opening the pipe orifice 14 from the closed state to the maximum degree of opening. When the compressed gas drives the blocking sheet 136 to move downwards, the high-pressure gas in the first gas pressure area flows through the pressure release hole 1361 on the blocking sheet 136. As the blocking sheet 136 continuously moves downwards, the degree of opening of the pipe orifice 14 is gradually increased, and finally, the pipe orifice 14 is in a fully opened state. In this way, the pressure on the surface of the one-way valve 12 can be adjusted, the buffer function can be achieved, and the one-way valve 12 can be protected.

Similarly, when pressure release is not required for the first gas pressure area, for example, when the pressure of the first gas pressure area is less than the preset pressure threshold, the first valve 1352 introduces the compressed gas provided by the compressed gas source 1351 to the second pressure introducing pipe 1354. After the compressed gas enters the second pressure introducing pipe 1354, the hydraulic fluid in the second pressure introducing pipe 1354 is driven to drive the blocking sheet 136 to move in a second direction (in FIG. 12A, FIG. 12B, and FIG. 12C, the second direction refers to an upward direction). In this case, under the drive of the compressed gas, the blocking sheet 136 gradually moves upwards, such that the pressure release hole 1361 is gradually separated from the pipe orifice 14 from top to bottom to gradually decrease the degree of opening of the pipe orifice 14 and gradually close the pipe orifice 14.

In FIG. 12B, under the drive of the compressed gas in the second pressure introducing pipe 1354, the blocking sheet 136 moves upwards, and the pipe orifice 14 does not coincide with the maximum opening position of the pressure release hole 1361, so that the pipe orifice 14 is partially closed. In FIG. 12A, under the drive of the compressed gas in the second pressure introducing pipe 1354, the blocking sheet 136 further moves upwards, and the pipe orifice 14 is in completely misalignment with the pressure release hole 1361, so that the pipe orifice 14 is completely closed.

That is to say, in FIG. 12C, FIG. 12B and FIG. 12A seriatim illustrate the process of gradually closing the pipe orifice 14 from the completely opened state to the complete closed state.

It should also be noted that there may be no hydraulic fluid in the first pressure introducing pipe 1353 and the second pressure introducing pipe 1354, and the blocking sheet 136 is directly driven by the compressed gas. No limitation is made thereto in the embodiments of the present disclosure.

In short, in the embodiments of the present disclosure, the basic principle of dynamically adjusting the degree of opening of the pipe orifice lies in that: the amounts of the compressed gases in the first pressure introducing pipe and the second pressure introducing pipe is controlled, through the first valve, to adjust the degree of opening of the pipe orifice, so as to appropriately prolong the buffer time during the opening of the one-way valve.

That is to say, the first valve can receive signals associated with the pressure of the first gas pressure area from a server. Upon receipt of a signal indicating that the pressure of the first gas pressure area is greater than or equal to the preset pressure threshold, the first valve introduces the compressed gas provided by the compressed gas source into the first pressure introducing pipe, the blocking sheet is driven to move to open the pipe orifice. Otherwise, upon receipt of a signal indicating that the pressure value of the first gas pressure area is less than the preset pressure threshold, the first valve introduces the compressed gas provided by the compressed gas source into the second pressure introducing pipe, the blocking sheet is driven to move to close the pipe orifice.

In some embodiments, as illustrated in FIG. 11, the hydraulic drive member may further include a second valve 1355 and a third valve 1356.

The second valve 1355 is located on the first pressure introducing pipe 1353 and is configured to adjust the flow rate of the compressed gas in the first pressure introducing pipe 1353.

The third valve 1356 is located on the second pressure introducing pipe 1354 and is configured to adjust the flow rate of the compressed gas in the second pressure introducing pipe 1354.

It should be noted that in the embodiments of the present disclosure, the flow rates of the compressed gases in the first pressure introducing pipe 1353 and the second pressure introducing pipe 1354 can also be controlled, so as to control the speed of opening or closing the pipe orifice 14. As illustrated in FIG. 11, the second valve 1355 is provided on the first pressure introducing pipe 1353, the third valve 1356 is provided on the second pressure introducing pipe 1354, and the second valve 1355 and the third valve 1356 may be, for example, a hand-operated valve.

The flow rate of the compressed gas in the first pressure introducing pipe 1353 can be adjusted by the second valve 1355, and the flow rate of the compressed gas in the second pressure introducing pipe 1354 can be adjusted by the third valve 1356, so as to control the acting time of the blocking sheet 136. When the flow rate of the compressed gas is slow, the blocking sheet 136 is driven to move at a low speed, so that the pipe orifice 14 is slowly opened or closed; and when the flow rate of the compressed gas is large, the blocking sheet 136 is driven to move at a high speed, so that the pipe orifice 14 is quickly opened or closed.

In some embodiments, the gas pressure balance valve is applied to a load locking chamber. The surface of the gas inlet end 111 of the valve body 11 includes external threads, and the load locking chamber includes corresponding internal threads.

It should be noted that in the embodiments of the present disclosure, the gas pressure balance valve can be applied to the load locking chamber, the surface of the gas inlet end 111 of the valve body 11 comprises the external threads, the load locking chamber comprises the corresponding internal threads. The gas pressure balance valve is connected to the chamber of the load locking chamber by threaded connection of the external threads on the surface of the gas inlet end 111 and the internal threads on the chamber of the load locking chamber, so as to maintain the balance between pressures of the chamber of the load locking chamber and the outside by the gas pressure balance valve.

It should also be noted that, in the embodiments of the present disclosure, the surface of the gas outlet end 112 of the gas pressure balance valve can also comprises threads, so that, if necessary, the gas pressure balance valve can also be connected to other devices or apparatuses.

The embodiment provides a gas pressure balance valve. The gas pressure balance valve includes: a valve body, a one-way valve and a buffer assembly. The valve body includes a gas inlet end and a gas outlet end, the gas inlet end is configured to be connected with a first gas pressure area, the gas outlet end is configured to be connected with a second gas pressure area. A relatively low and a relatively high pressure state are existed between the first gas pressure area and the second gas pressure area. The one-way valve is located in the valve body, and configured to perform pressure adjustment to achieve the balance between the pressures of the first gas pressure area and the second gas pressure area. The buffer assembly is located between the gas inlet end and the one-way valve, and configured to adjust the pressure on the surface of the one-way valve. In this case, by adding the buffer assembly capable of adjusting the pressure on the surface of the one-way valve between the gas inlet end and the one-way valve, the surface of the one-way valve will not be suddenly subjected to a high pressure, thus the function of protecting the one-way valve can be achieved and damage to the one-way valve can be avoided. That is to say, in the embodiments of the present disclosure, the one-way non-return valve is protected, the irreversible impact applied onto the valve due to instantaneous pressure release is relieved, and thus the service life of the valve is prolonged.

In another embodiment of the present disclosure, FIG. 13 illustrates a schematic flowchart of a gas pressure balance valve provided in embodiments of the present disclosure. As illustrated in FIG. 13, the method may include the following.

At S1301: a gas pressure balance valve is provided between a first gas pressure area and a second gas pressure area having pressure difference therebetween. The gas inlet end of a valve body of the gas pressure balance valve is connected with the first gas pressure area, and the gas outlet end of the valve body is connected with the second gas pressure area.

At S1302: the pressure of the first gas pressure area is adjusted through the buffer assembly and the one-way valve in the valve body to achieve the balance between the pressures of the first gas pressure area and the second gas pressure area.

It should be noted that the gas pressure balance method provided in the embodiments of the present disclosure can be applied to the gas pressure balance valve of the foregoing embodiment. The gas pressure balance valve is provided between the first gas pressure area and the second gas pressure area. The pressure of the first gas pressure area can be set according to actual process requirements. When the pressure release of the first gas pressure area is required, through adjustment by the buffer assembly and the one-way valve, the gas of the first gas pressure area is discharged to the second gas pressure area, so as to achieve the balance between the pressures of the first gas pressure area and the second gas pressure area.

Specifically, the first gas pressure area may be a chamber of a load locking chamber, and the second gas pressure area may be the external atmosphere. When the first gas pressure area is in a negative pressure state, the first gas pressure area is in the relatively low pressure state, and the second gas pressure area is in the relatively high pressure state. When the pressure of the first gas pressure area is raised, the pressure of the first gas pressure area would be gradually increased. When the pressure of the first gas pressure area is increased to be greater than the pressure of the second gas pressure area, the first gas pressure area is in the relatively high pressure state and the second gas pressure area is in the relatively low pressure state, in which case the pressure release of the first gas pressure area is required, i.e., the gas of the first gas pressure area is discharged to the second gas pressure area through the gas pressure balance valve to maintain the balance between the pressures of the first gas pressure area and the second gas pressure area.

The flow rate of the gas of the first gas pressure area flowing to the one-way valve is adjusted through the buffer assembly, so as to adjust the pressure on the surface of the one-way valve, such that the one-way valve will not be suddenly subjected to a high pressure, thus avoiding damage to the one-way valve. After the one-way valve is opened, the gas of the first gas pressure area is discharged to the second gas pressure area to achieve pressure balance.

In some embodiments, the method may further include an operation in which the pressure on the surface of the one-way valve is dynamically adjusted according to the change in the pressure of the first gas pressure area through the buffer assembly.

It should be noted that in the embodiments of the present disclosure, the pressure on the surface of the one-way valve can be dynamically adjusted through the buffer assembly on the basis of the change in the pressure of the first gas pressure area.

In some embodiments, the dynamic adjustment of the pressure on the surface of the one-way valve through the buffer assembly according to the change in the pressure of the first gas pressure area may include operations in which the buffer assembly is moved in a preset direction according to the pressure of the first gas pressure area, and the degree of opening of a pipe orifice is adjusted according to the movement of the buffer assembly in the preset direction, so as to adjust the pressure on the surface of the one-way valve.

It should be noted that the preset direction here may include the first direction and the second direction in the foregoing embodiments, and the first direction and the second operation are opposite to each other. Illustratively, taking FIG. 9A and FIG. 9B or FIG. 12A, FIG. 12B, and FIG. 12C as an example, the first direction is the downward direction, and the second direction is the upward direction. Or, when the gas pressure balance valve is provided at other angles, the first direction may be the leftward direction and the second direction may be the rightward direction, etc. No limitation is made thereto in the embodiments of the present disclosure.

In some embodiments, the operation of moving the buffer assembly in a preset direction according to the pressure of the first gas pressure area may include a operation in which the blocking sheet is driven to move in the preset direction according to the pressure of the first gas pressure area.

In some embodiments, the preset direction includes the first direction and the second direction, and the first direction and the second operation are opposite to each other.

The operation of driving the blocking sheet to move in the preset direction according to the pressure of the first gas pressure area may include: in response to the pressure of the first gas pressure area being greater than the preset pressure threshold, the blocking sheet is driven to move in the first direction; and in response to the pressure of the first gas pressure area being less than the preset pressure threshold, the blocking sheet is driven to move in the second direction.

In some embodiments, the buffer blocking sheet includes a pressure release hole having a first end and a second end. The opening of the pressure release hole on the blocking sheet is flared from the second end to the first end. The first end is the maximum opening position of the pressure release hole, and the inner diameter at the maximum opening position is greater than or equal to the inner diameter of the pipe orifice.

The adjustment of the degree of opening of the pipe orifice according to the movement of the buffer assembly in the preset direction may include: when the blocking sheet moves in the first direction, the pressure release hole on the blocking sheet is controlled to be gradually opened from the second end to the first end, to increase the degree of opening of the pipe orifice until the pipe orifice is completely opened; and when the blocking sheet moves in the second direction, the pressure release hole on the blocking sheet is controlled to be gradually closed from the first end to the second end, to decrease the degree of opening of the pipe orifice until the pipe orifice is completely closed.

It should be noted that in the embodiments of the present disclosure, the first end of the pressure release hole is the larger end of the pressure release hole in the foregoing embodiments, and is generally the maximum opening position of the pressure release hole, and the inner diameter of the first end is greater than or equal to the inner diameter of the pipe orifice. The second end is the smaller end of the pressure release hole.

In some embodiments, the operation of driving the blocking sheet to move in the first direction may include: a compressed gas is introduced through a first pressure introducing pipe, and the blocking sheet is driven by the compressed gas to move in the first direction. The operation of driving the blocking sheet to move in the second direction may include: a compressed gas is introduced through a second pressure introducing pipe, and the blocking sheet is driven by the compressed gas to move in the second direction.

It should be noted that when the blocking sheet is driven by the compressed gas to move in the first direction or the second direction, the compressed air can be used for directly driving the blocking sheet. In another example, hydraulic fluids are provided in the first pressure introducing pipe and the second pressure introducing pipe and then the compressed air drives the hydraulic fluid to drive the blocking sheet to move.

In some embodiments, the method may further include the following operations.

The flow rate of the compressed gas introduced into the first pressure introducing pipe is controlled by a second valve, so as to control the acting time of the baffle moving in the first direction.

The flow rate of the compressed gas introduced into the second pressure introducing pipe is controlled by a third valve, so as to control the acting time of the baffle moving in the second direction.

In some embodiments, the introducing of the compressed gas through the first pressure introducing pipe may include operation that the compressed gas provided by a compressed gas source, is introduced into the first pressure introducing pipe through a first valve.

The introducing of the compressed gas through the second pressure introducing pipe may include operation that the compressed gas provided by the compressed gas source is introduced into the second pressure introducing pipe through the first valve.

The embodiment provides a gas pressure balance method, applied to the gas pressure balance valve of the foregoing embodiments. The method may include: providing a gas pressure balance valve between a first gas pressure area and a second gas pressure area having a pressure difference therebetween, with a gas inlet end of a valve body of the gas pressure balance valve being connected with the first gas pressure area, and a gas outlet end being connected with the second gas pressure area; and adjusting the pressure of the first gas pressure area through a buffer assembly and a one-way valve in the valve body, to achieve the balance between the pressures of the first gas pressure area and the second gas pressure area. In the embodiments of the present disclosure, the pressure on the surface of the one-way valve is adjusted through the buffer assembly, such that the surface of the one-way valve will not be suddenly subjected to a high pressure, thus the function of protecting the one-way valve and avoiding damage to the one-way valve can be achieved.

Figure 14:
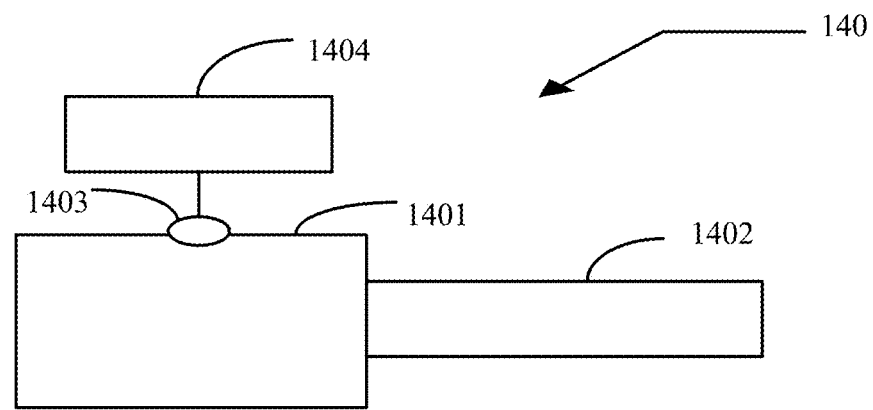
FIG. 14 illustrates a schematic view of the structure of a load locking chamber provided in embodiments of the present disclosure.

In yet another embodiment of the present disclosure, FIG. 14 illustrates a schematic view of a load locking chamber provided in embodiments of the present disclosure. As illustrated in FIG. 14, the load locking chamber 140 may include: a chamber 1401, the gas pressure balance valve 1402 of any one of the foregoing embodiments and a suction port 1403.

The chamber 1401 can be opened and closed, and is configured to accommodate a substrate.

A gas inlet end of a valve body of the gas pressure balance valve 1402 is connected with the chamber 1401, and a gas outlet end of the valve body of the gas pressure balance valve is connected with the atmospheric environment.

The suction port 1403 is formed on the chamber 1401, and connected to a suction pump 1404 for adjusting the pressure in the chamber 1401 through the suction port 1403.

It should be noted that, in the embodiments of the present disclosure as illustrated in FIG. 14, the load locking chamber includes a chamber 1401, the gas pressure balance valve 1402 and a suction port 1403. The chamber 1401 can be opened and closed, and is configured to accommodate a substrate. The gas pressure balance valve 1402 is the gas pressure balance valve of any one of the foregoing embodiments. The gas inlet end of the gas pressure balance valve 1402 is connected to the chamber 1401, and a gas outlet end of the gas pressure balance valve is connected with the atmospheric environment, that is, the chamber is equivalent to the first gas pressure area, and the atmospheric environment is equivalent to the second gas pressure area. The balance between the pressures of the chamber and the atmospheric environment is maintained when the pressure release of the chamber 1401 is performed through the gas pressure balance valve 1402.

A suction port 1403 is formed on the chamber 1401, and the suction port 1403 is connected to a suction pump 1404. The suction pump 1404 pumps the gas to the chamber 1401 (inflation) or suctions the gas in the chamber 1401 through the suction port 1403, so as to adjust the pressure in the chamber 1401.

That is to say, depending on different processes in a production process, the chamber 1401 may need to maintain a vacuum pressure state, or may need to be supplied with the gas to maintain a specific pressure. In the case of dynamic adjustment of the gas pressure balance valve, when the chamber 1401 needs to be maintained at the vacuum state, the suction pump 1404 suctions the gas in the chamber through the suction port 1403 to gradually reduce the pressure in the chamber 1401. When the pressure in the chamber 1401 is less than the preset pressure threshold, a buffer assembly of the gas pressure balance valve will act to gradually close a pipe orifice. When the chamber 1401 does not need to be maintained at the vacuum state, the suction pump 1404 pumps the gas to the chamber through the suction port 1403, to gradually increase the pressure in the chamber 1401. When the pressure in the chamber 1401 is greater than the preset pressure threshold, the buffer assembly of the gas pressure balance valve will act to gradually open the pipe orifice, thereby maintaining the balance between the pressures of the chamber 1401 and the atmospheric environment by performing pressure release through the gas pressure balance valve.

Figure 15:
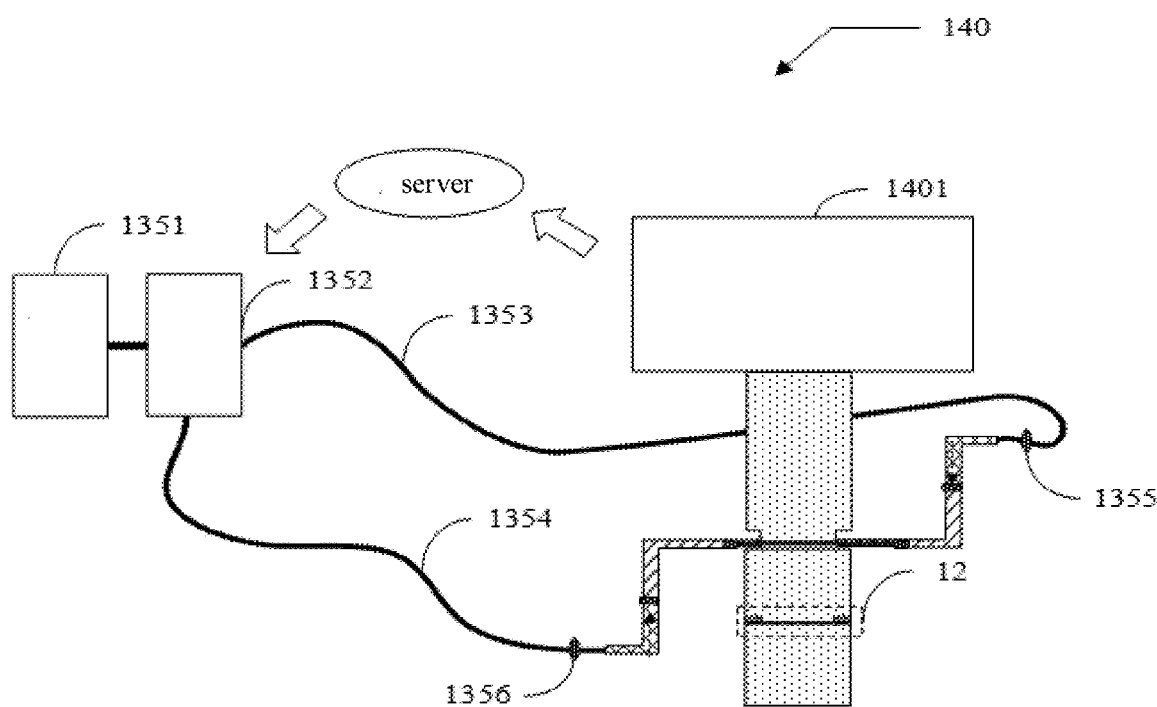
FIG. 15 illustrates a schematic view of a load locking chamber provided in embodiments of the present disclosure.

Further, FIG. 15 illustrates a schematic view of a load locking chamber provided in embodiments of the present disclosure. As illustrated in FIG. 15, a chamber 1401 of a load locking chamber and a first valve 1352 of a gas pressure balance valve can communicate with a server, so as to send the value of the pressure of the chamber 1401 to the first valve 1352 in real time. As such, the first valve 1352 introduces, according the pressure of the chamber 1401, a compressed gas provided by a compressed gas source 1351 into a first pressure introducing pipe 1353 or a second pressure introducing pope 1354, so as to drive a blocking sheet to move in one of the different directions to control the pipe orifice to be opened or closed.

In some embodiments, the load locking chamber is connected to an atmospheric transfer chamber and a vacuum transfer chamber, and the load locking chamber is configured to transfer an untreated substrate from the atmospheric transfer chamber to the vacuum transfer chamber and to transfer the treated substrate from the vacuum transfer chamber to the atmospheric transfer chamber.

It should be noted that in a process for manufacturing a semiconductor device, a substrate (such as a semiconductor wafer) may be subjected to vacuum treatment such as etching. In the embodiments of the present disclosure, the load locking chamber can be connected to the atmospheric transfer chamber and the vacuum transfer chamber, and the vacuum transfer chamber can further be connected to a vacuum treatment chamber. When the chamber of the load locking chamber is in a vacuum state, the untreated substrate is transferred from the atmospheric transfer chamber to the vacuum treatment chamber through the load locking chamber and the vacuum transfer chamber. After the substrate is treated in the vacuum treatment chamber, the treated substrate is then transferred from the vacuum transfer chamber to the load locking chamber. After the pressure of the chamber of the load locking chamber is adjusted to the atmospheric pressure, the treated substrate is transferred from the load locking chamber to the atmospheric transfer chamber and then supplied to another production line.

Taking the load locking chamber of a certain machine as an example, in an actual production process, when a substrate is ready to be fed into the vacuum transfer chamber from the atmospheric transfer chamber or to be fed into the atmospheric transfer chamber from the vacuum transfer chamber, the load locking chamber serves as a vacuum-atmosphere conversion area, in which inflation, pressure release, and vacuumizing will be performed frequently.

Specifically, the load locking chamber may include a low-pressure area B and a high-pressure area A. When a substrate is ready to be transferred to the atmospheric transfer chamber, the gas is rapidly pumped to the low-pressure area B. When the pressure exceeds 760 T, the gas pressure balance valve will work immediately to implement pressure release to release excessive pressure, so that the pressure of the low-pressure area B matches the pressure of the atmospheric transfer chamber. Rapid pressure release may cause damage to the gas pressure balance valve. In the improved gas pressure balance valve according to the embodiments of the present disclosure, the buffer assembly is additionally provided to the existing gas pressure balance valve, thereby implementing the function of buffering the released gas and prolonging the service life of the gas pressure balance valve. In such a process, taking FIG. 12A, FIG. 12B, and FIG. 12C as an example, the pipe orifice will seriatim undergo the change in FIG. 12A-FIG. 12B-FIG. 12C.

When the substrate is ready to be transferred to the vacuum transfer chamber, the high-pressure area A will be quickly vacuumized to obtain the pressure matching the pressure of the vacuum transfer chamber. In such a process, taking FIG. 12A, FIG. 12B, and FIG. 12C as an example, the pipe orifice will seriatim undergo the change in FIG. 12C-FIG. 12B-FIG. 12A.

The load locking chamber includes the gas pressure balance valve of the foregoing embodiments. Since the buffer assembly in the gas pressure balance valve can adjust the pressure on the surface of the one-way valve, the surface of the one-way valve will not be suddenly subjected to a high pressure, thus the function of protecting the one-way valve and avoiding damage to the one-way valve can be achieved.

The foregoing description merely relate to preferred embodiments of the present disclosure, but is not intended to limit the scope of protection of the present disclosure.

It should be noted that the terms "include", "comprise" or any other variants thereof in the present disclosure are intended to cover non-exclusive inclusion, so that a process, method, article or apparatus that includes a series of elements includes not only those elements, but also other elements that are not explicitly listed or elements inherent to the process, method, article, or apparatus. If no more limitations is made, an element defined by a phrase "including one . . . " does not exclude that there are other identical elements in the process, method, article or apparatus including the element.

The serial numbers of the foregoing embodiments of the present disclosure are only for description, and do not represent any advantages and disadvantages of the embodiments.

The methods recited in the method embodiments provided in the present disclosure can be arbitrarily combined without causing conflicts so as to obtain new method embodiments.

The features recited in product embodiments provided in the present disclosure can be arbitrarily combined without causing conflicts so as to obtain new product embodiments.

The features recited in the method or device embodiments provided in the present disclosure can be arbitrarily combined without causing conflicts so as to obtain new method or device embodiments.

The descriptions above are only specific implementations of the present disclosure; however, the scope of protection of the present disclosure is not limited thereto. Within the technical scope recited by the present disclosure, any variation or substitution that can be easily conceived of by persons skilled in the art should all fall within the scope of protection of the present disclosure. Therefore, the scope of protection of the present disclosure should be determined by the scope of protection of the claims.

In embodiments of the present disclosure, a gas pressure balance valve includes: a valve body, where the valve body includes a gas inlet end and a gas outlet end, the gas inlet end is configured to be connected with a first gas pressure area, the gas outlet end is configured to be connected with a second gas pressure area, and a pressure difference is existed between the first gas pressure area and the second gas pressure area; a one-way valve, located in the valve body, and configured to perform adjustment to achieve the balance between the pressures of the first gas pressure area and the second gas pressure area; and a buffer assembly, located between the gas inlet end and the one-way valve, and configured to adjust the pressure on the surface of the one-way valve. In this case, the buffer assembly is additionally provided between the gas inlet end and the one-way valve, and the buffer assembly can adjust the pressure on the surface of the one-way valve, such that the surface of the one-way valve will not be suddenly subjected to a high pressure, thus implementing the function of protecting the one-way valve. Therefore, the present disclosure not only can solve the problem of damage caused by the impact on the one-way valve during pressure release, but also can prolong the service life of the one-way valve.

What is claimed is:

1. A gas pressure balance valve, comprising: a valve body comprising a gas inlet end and a gas outlet end, wherein the gas inlet end is configured to be connected with a first gas pressure area, the gas outlet end is configured to be connected with a second gas pressure area, and a pressure difference is existed between the first gas pressure area and the second gas pressure area; a one-way valve, located in the valve body, and configured to perform a pressure adjustment to achieve the balance between pressures of the first gas pressure area and the second gas pressure area; and a buffer assembly, located between the gas inlet end and the one-way valve, and configured to adjust a pressure on a surface of the one-way valve; wherein the valve body comprises a first pipe and a second pipe, one end of the first pipe forms the gas inlet end, one end of the second pipe forms the gas outlet end, and the other end of the first pipe and the other end of the second pipe face towards each other and form a pipe orifice; and wherein the one-way valve is located in the second pipe, the buffer assembly is located at the pipe orifice and acts along with a change in the pressure of the first gas pressure area to adjust a degree of opening of the pipe orifice and then dynamically adjust the pressure on the surface of the one-way valve; wherein an area between the one-way valve and the pipe orifice forms a buffer space, the buffer assembly comprises a drive member and a blocking sheet, and the blocking sheet is connected to the drive member and movable with respect to the pipe orifice under the drive of the drive member to adjust the degree of opening of the pipe orifice; wherein the drive member comprises at least one of a hydraulic drive member, a pneumatic drive member, or a motor drive member; wherein the hydraulic drive member comprises: a compressed gas source; a first valve, connected to the compressed gas source; a first pressure introducing pipe, wherein one end of the first pressure introducing pipe is connected to the first valve, the other end of the first pressure introducing pipe abuts against one end of the blocking sheet, and a hydraulic fluid is provided in the first pressure introducing pipe; and a second pressure introducing pipe, wherein one end of the second pressure introducing pipe is connected to the first valve, the other end of the second pressure introducing pipe abuts against the other end of the blocking sheet, and a hydraulic fluid is provided in the second pressure introducing pipe, wherein the compressed gas source is configured to supply a compressed gas into the first pressure introducing pipe or the second pressure introducing pipe through the first valve, to drive the hydraulic fluid to drive the blocking sheet to move.

2. The gas pressure balance valve of claim 1, wherein the hydraulic drive member further comprises a second valve and a third valve, the second valve is located on the first pressure introducing pipe, to adjust a flow rate of the compressed gas in the first pressure introducing pipe; and the third valve is located on the second pressure introducing pipe, to adjust a flow rate of the compressed gas in the second pressure introducing pipe.

3. The gas pressure balance valve of claim 1, wherein a pressure release hole is formed on the blocking sheet, and under the drive of the drive member, the degree of opening of the pipe orifice is adjusted by the blocking sheet through the pressure release hole.

4. The gas pressure balance valve of claim 3, wherein an opening of the pressure release hole on the blocking sheet is flared from one end to the other end, wherein an inner diameter at a maximum opening position of the pressure release hole is greater than or equal to an inner diameter of the pipe orifice.

5. The gas pressure balance valve of claim 1, wherein the gas pressure balance valve is applied to a load locking chamber, surface of the gas inlet end of the valve body comprises external threads, and the load locking chamber comprises corresponding internal threads.

6. A gas pressure balance method using the gas pressure balance valve of claim 1, comprising: providing the gas pressure balance valve between a first gas pressure area and a second gas pressure area having a pressure difference therebetween, with the gas inlet end of the valve body of the gas pressure balance valve being connected with the first gas pressure area, and the gas outlet end being connected with the second gas pressure area; and adjusting the pressure of the first gas pressure area, wherein a pressure of the first gas pressure area is adjusted through a buffer assembly and a one-way valve in the valve body, to achieve a balance between pressures of the first gas pressure area and the second gas pressure area.

7. The gas pressure balance method of claim 6, further comprising: dynamically adjusting a pressure on the surface of the one-way valve through the buffer assembly according to a change in the pressure of the first gas pressure area.

8. A load locking chamber, comprising: a chamber, configured to accommodate a substrate; the gas pressure balance valve of claim 1, wherein the gas inlet end of the valve body of the gas pressure balance valve is connected with the chamber, and the gas outlet end is connected with an atmospheric environment; and a suction port, formed on the chamber and connected to a suction pump for adjusting a pressure in the chamber through the suction port.

9. The load locking chamber of claim 8, wherein the load locking chamber is connected to an atmospheric transfer chamber and a vacuum transfer chamber, and the load locking chamber is configured to transfer an untreated substrate from the atmospheric transfer chamber to the vacuum transfer chamber and to transfer a treated substrate from the vacuum transfer chamber to the atmospheric transfer chamber.

10. A gas pressure balance valve, comprising: a valve body comprising a gas inlet end and a gas outlet end, wherein the gas inlet end is configured to be connected with a first gas pressure area, the gas outlet end is configured to be connected with a second gas pressure area, and a pressure difference is existed between the first gas pressure area and the second gas pressure area; a one-way valve, located in the valve body, and configured to perform a pressure adjustment to achieve the balance between pressures of the first gas pressure area and the second gas pressure area; and a buffer assembly, located between the gas inlet end and the one-way valve, and configured to adjust a pressure on a surface of the one-way valve; wherein the valve body comprises a first pipe and a second pipe, one end of the first pipe forms the gas inlet end, one end of the second pipe forms the gas outlet end, and the other end of the first pipe and the other end of the second pipe face towards each other and form a pipe orifice; and wherein the one-way valve is located in the second pipe, the buffer assembly is located at the pipe orifice and acts along with a change in the pressure of the first gas pressure area to adjust a degree of opening of the pipe orifice and then dynamically adjust the pressure on the surface of the one-way valve; wherein an area between the one-way valve and the pipe orifice forms a buffer space, the buffer assembly comprises a drive member and a blocking sheet, and the blocking sheet is connected to the drive member and movable with respect to the pipe orifice under the drive of the drive member to adjust the degree of opening of the pipe orifice; wherein a pressure release hole is formed on the blocking sheet, and under the drive of the drive member, the degree of opening of the pipe orifice is adjusted by the blocking sheet through the pressure release hole.

11. The gas pressure balance valve of claim 10, wherein an opening of the pressure release hole on the blocking sheet is flared from one end to the other end, wherein an inner diameter at a maximum opening position of the pressure release hole is greater than or equal to an inner diameter of the pipe orifice.

12. The gas pressure balance valve of claim 10, wherein the gas pressure balance valve is applied to a load locking chamber, surface of the gas inlet end of the valve body comprises external threads, and the load locking chamber comprises corresponding internal threads.

13. A gas pressure balance method using the gas pressure balance valve of claim 10, comprising: providing the gas pressure balance valve between a first gas pressure area and a second gas pressure area having a pressure difference therebetween, with the gas inlet end of the valve body of the gas pressure balance valve being connected with the first gas pressure area, and the gas outlet end being connected with the second gas pressure area; and adjusting the pressure of the first gas pressure area, wherein a pressure of the first gas pressure area is adjusted through a buffer assembly and a one-way valve in the valve body, to achieve a balance between pressures of the first gas pressure area and the second gas pressure area.

14. The gas pressure balance method of claim 13, further comprising: dynamically adjusting a pressure on the surface of the one-way valve through the buffer assembly according to a change in the pressure of the first gas pressure area.

15. A load locking chamber, comprising: a chamber, configured to accommodate a substrate; the gas pressure balance valve of claim 10, wherein the gas inlet end of the valve body of the gas pressure balance valve is connected with the chamber, and the gas outlet end is connected with an atmospheric environment; and a suction port, formed on the chamber and connected to a suction pump for adjusting a pressure in the chamber through the suction port.

16. The load locking chamber of claim 15, wherein the load locking chamber is connected to an atmospheric transfer chamber and a vacuum transfer chamber, and the load locking chamber is configured to transfer an untreated substrate from the atmospheric transfer chamber to the vacuum transfer chamber and to transfer a treated substrate from the vacuum transfer chamber to the atmospheric transfer chamber.

* * * * *